(12) United States Patent
Hales et al.

(10) Patent No.: US 8,410,967 B2
(45) Date of Patent: Apr. 2, 2013

(54) COMPARATOR CIRCUIT

(75) Inventors: Rex K. Hales, Riverton, UT (US); Paul Talmage Watkins, Midvale, UT (US)

(73) Assignee: Crest Semiconductors, Inc., San Jose, CA (US)

( * ) Notice: Subject to any disclaimer, the term of this patent is extended or adjusted under 35 U.S.C. 154(b) by 205 days.

(21) Appl. No.: 12/956,733

(22) Filed: Nov. 30, 2010

(65) Prior Publication Data
US 2012/0133539 A1 May 31, 2012

(51) Int. Cl.
*H03M 1/34* (2006.01)

(52) U.S. Cl. .......................... 341/158; 341/155

(58) Field of Classification Search ........... 341/155–158
See application file for complete search history.

(56) References Cited

U.S. PATENT DOCUMENTS

| | | | | |
|---|---|---|---|---|
| 4,910,518 A * | 3/1990 | Kim et al. | ...................... | 341/155 |
| 6,831,586 B2 * | 12/2004 | Jansson | .......................... | 341/158 |
| 7,081,845 B2 * | 7/2006 | Hales et al. | ................... | 341/158 |
| 2008/0094267 A1 * | 4/2008 | Yen | ................................ | 341/155 |

* cited by examiner

*Primary Examiner* — Jean B Jeanglaude

(74) *Attorney, Agent, or Firm* — Steven L. Nichols; Van Cott, Bagley, Cornwall & McCarthy P.C.

(57) ABSTRACT

An analog-to-digital converter includes a comparator configured to receive a first input signal and a second input signal, in which at least one of the input signals is received between two transistors, each of the transistors being in common-gate configuration. A method for comparing input signals performed by a comparator circuit includes: receiving a first input signal between a drain terminal of a first transistor of the comparator circuit and a source terminal of a second transistor of the comparator circuit; receiving a second input signal; and outputting a value based on a comparison of the first input signal and the second input signal.

21 Claims, 8 Drawing Sheets

900

Receive a first analog signal between a first set of two transistors associated with the comparator circuit, the transistors from said first set of two transistors being in a common gate configuration
(step 902)

Receive a second analog signal
(step 904)

Combine the first analog signal with a reference signal
(step 906)

Output a value based on a comparison of the first analog signal and the second analog signal
(step 908)

*Fig. 9*

COMPARATOR CIRCUIT

BACKGROUND

Electronic devices typically make use of both analog and digital signals. An analog signal is a continuous signal which may assume any value. A digital signal is one in which may assume one of a discrete set of values. A signal may be in the form of an electrical current or a voltage. Electrical current is the measurement of the flow of electrons. Voltage may be defined as the difference between electric potential at two given points.

Electronic circuitry often includes devices for transferring analog signals into digital signals and vice versa. One component which may be used in such transferring is referred to as a comparator. Generally, a comparator is an electronic circuit device configured to receive two input signals and output one of two values based on the input signals.

One characteristic of a comparator device is output capacitance. Generally, the larger the output capacitance of the device is, the longer it will take for the output signal to switch from one value to another in response a change in one of the input signals. Thus, it is desirable that a comparator device have a low output capacitance. The lower the output capacitance, the faster the device is able to operate.

SUMMARY

An analog-to-digital converter includes a comparator configured to receive a first input signal and a second input signal, in which at least one of the input signals is received between two transistors associated with said comparator, each of the transistors being in common-gate configuration.

BRIEF DESCRIPTION OF THE DRAWINGS

The accompanying drawings illustrate various embodiments of the principles described herein and are a part of the specification. The illustrated embodiments are merely examples and do not limit the scope of the claims.

FIG. 9 is a flow chart showing an illustrative method for comparing electrical signals, according to one embodiment of principles described herein.

Throughout the drawings, identical reference numbers designate similar, but not necessarily identical, elements.

DETAILED DESCRIPTION

Figure 1:
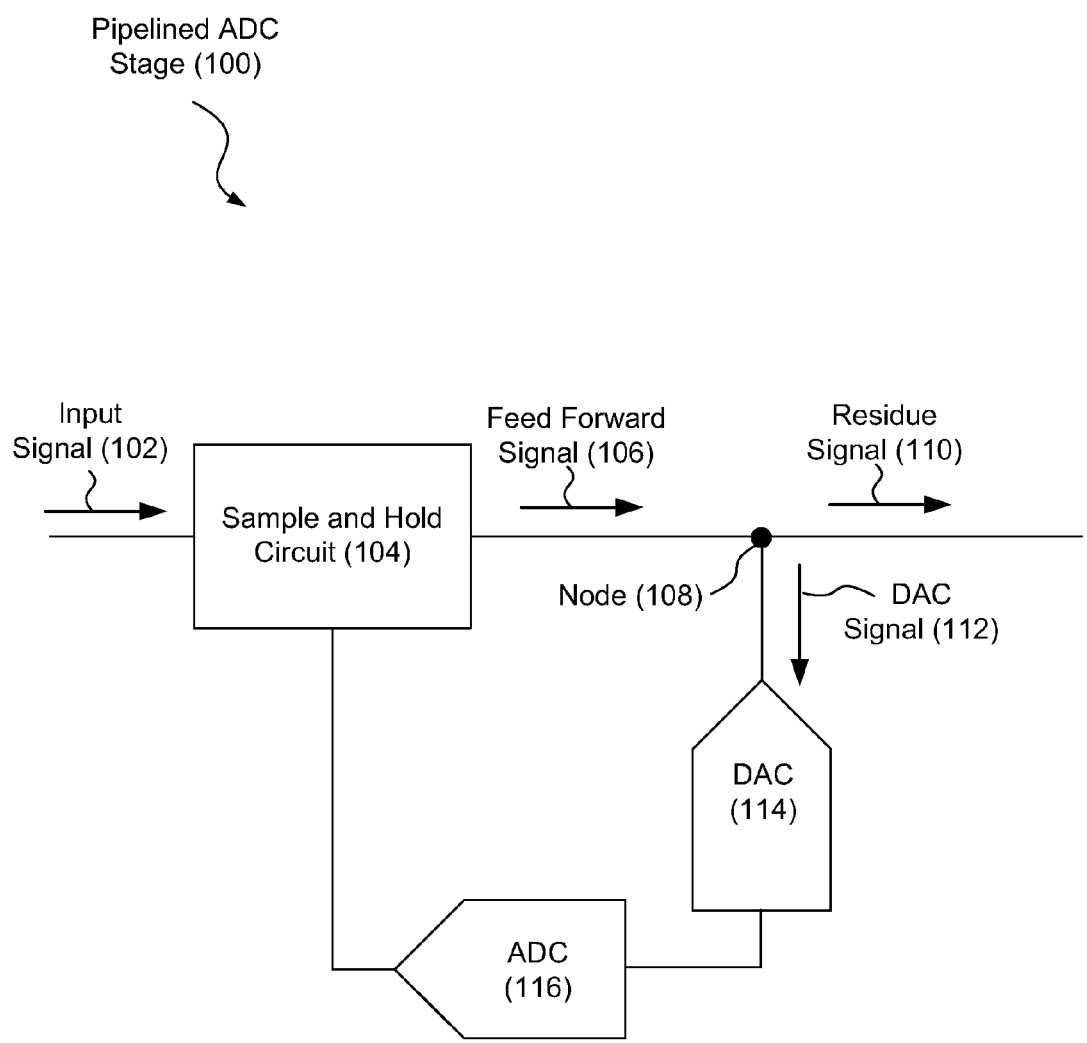
FIG. 1 is diagram showing an illustrative stage of a pipelined analog-to-digital converter, according to one embodiment of principles described herein.

The present specification discloses systems and methods related to a comparator circuit which may be used by an analog to digital circuit. And more particularly, to a comparator circuit which is configured to receive input signals to be compared between two common gate configured transistors. By receiving the input signals in such a manner, a comparator circuit which includes reduced power consumption, fewer components, lower cost, faster operating speeds, simplified layout, and higher accuracy may be realized.

As used in the present specification and in the appended claims, the term "NMOS" refers to an n-channel metal-oxide-semiconductor field—effect transistor (MOSFET) and the term "PMOS" refers to a p-channel MOSFET. An NMOS device is activated, allowing current to flow between the drain and the source, when a high input is applied to its gate in relation to its body, and a PMOS device is activated when a low input is applied to its gate in relation to its body. Combinations of NMOS and PMOS devices may be used in implementing logic gates, digital circuitry, analog circuitry and other electronic systems.

As used in the present specification and in the appended claims, the term "current sense amplifier" refers to a circuit for detecting small changes or differences in current from two different sources (e.g., differentially). The circuit may include a memory cell configured to hold an output value as a result of comparing two input currents until new current values are input into the current sense amplifier.

As used in the present specification and in the appended claims, the term "signal" is to be broadly interpreted as an electrical signal which may be in the form of an electrical current or a voltage. A signal may refer to either an analog signal or a digital signal.

In the following description, for purposes of explanation, numerous specific details are set forth in order to provide a thorough understanding of the present systems and methods. It will be apparent, however, to one skilled in the art that the present systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

A comparator essentially operates by comparing two input signals and outputting a particular value based on a comparison of the two input signals. For example, a comparator may output a relatively high signal value if a first input signal is greater in value than a second input signal. Furthermore, the comparator may output a relatively low signal value if the first input is lower in value than the second input signal. As the value of the input signals may change over time, the output may adjust accordingly in response to changes in the input signals.

Comparators may be used in a wide variety of electronic circuits. One such circuit is an analog-to-digital converter. To illustrate the applicability of comparator circuits used by ADCs, this specification will describe the function of a pipelined ADC. Although the comparator described herein is illustrated in the context of a pipelined ADC, it is to be understood that a comparator embodying principles described herein may be used for a wide variety of electronic circuits.

Referring now to the figures, FIG. 1 is a diagram showing an illustrative pipelined ADC stage (100). A pipelined ADC converts an analog signal into a digital signal using multiple successive stages. According to certain illustrative embodiments, each stage (100) within a pipelined ADC may include a sample and hold circuit (104) a Digital-to-Analog Converter (DAC) (114), and an ADC (116).

A sample and hold circuit essentially operates in two modes. One mode is a "sample" mode, sometimes referred to as a "track" mode. The other mode is a "hold" mode. While the sample and hold circuit is in "sample" mode, the output current is intended to match the input current (102). While the sample and hold circuit is in "hold" mode, the output current is intended to maintain the value experienced by the input at the time the circuit was switched from "sample" mode to "hold" mode. The sample and hold circuit thus produces a sampled output signal.

In one embodiment of a pipelined ADC, one output of the sample and hold circuit (104) may be used as a feed forward signal (106). An additional output of the sample and hold circuit (104) may provide a signal to a low resolution ADC (116). The ADC (116) may then pass the digital signal to the DAC (108). The DAC may then pass the signal to a summing node (108). The combination of the feed forward signal (106) and the DAC signal (112) produced by the DAC (114) may produce a residue signal (110). The residue signal (110) may then continue on to a subsequent stage within the pipelined ADC or to the final output of the ADC.

If the signals associated with the pipelined ADC are in the form of an electrical current, then the value of the residue signal (110) is in accordance with Kirchhoff's current law. Kirchhoff's current law states that the amount of electrical current entering a node must be equal to the amount of electrical current leaving a node. Thus the summation of the DAC signal (112) and the feed forward signal (106) is equal to the residue signal (110). If current is flowing into a node, it is given a positive value. Conversely, if current is flowing out of a node, it is given a negative value. Thus, the residue signal (110) may be equal to the feed forward signal (106) minus the DAC signal (112).

The sample and hold circuit (104) in each pipeline stage (100) holds an analog signal at a specific value for a given period of time. The given period of time is generally designed to be as short as possible while still allowing all of the components within the present stage to process the signal at the held value. As mentioned above, the sample and hold circuit may include two outputs. One output sends the signal to be processed by the ADC and the DAC. The DAC may then produce an output which is combined with the second output from the sample and hold circuit (104). The combination of the feed forward signal (106) and the DAC signal (112) results in the DAC signal (112) being subtracted from the feed forward signal (106). Thus the quantized component of the feed forward signal (106) is removed and the resulting residue signal (110) is sent to the next stage. In some cases the reside current may be in the range of 10-100 microamps (μA). In some embodiments, the residue signal (110) may need to be amplified before being sent to the next stage for processing.

As the input signal (102) moves through each successive stage (100) in the pipelined ADC, a more precise value may be determined. The number of stages may represent the number of bits used to represent a given signal value. The first stage may represent the most significant bit and the last stage may represent the least significant bit.

In some embodiments, the input signal (102) to a pipelined ADC may be a voltage signal. In such an embodiment, the first stage of the pipelined ADC may include a voltage-to-current converter. In some embodiments, the sample and hold circuit (104) may act as a voltage-to-current converter. Such a device may sample a voltage and output a corresponding electrical current.

In certain embodiments, the ADC (116) may be a flash ADC. Flash ADCs are able to operate at faster rates. However, they require the use of several comparator circuits. Both the ADC (116) and the DAC (114) may be low resolution devices. Low resolution devices use fewer bits and provide a lower level of precision. High resolution devices may not be necessary to perform the intended functions associated with the ADC (116) and the DAC (114) in each pipeline stage.

A current mode pipelined ADC system may be capable of processing any number of bits needed by a particular application. For example, the ADC and DAC in each stage may be a 4-bit flash ADC and a 4-bit DAC, respectively. Alternatively, each stage may be capable of processing 3 bits, 5 bits or any other practical numbers of bits.

Figure 2:
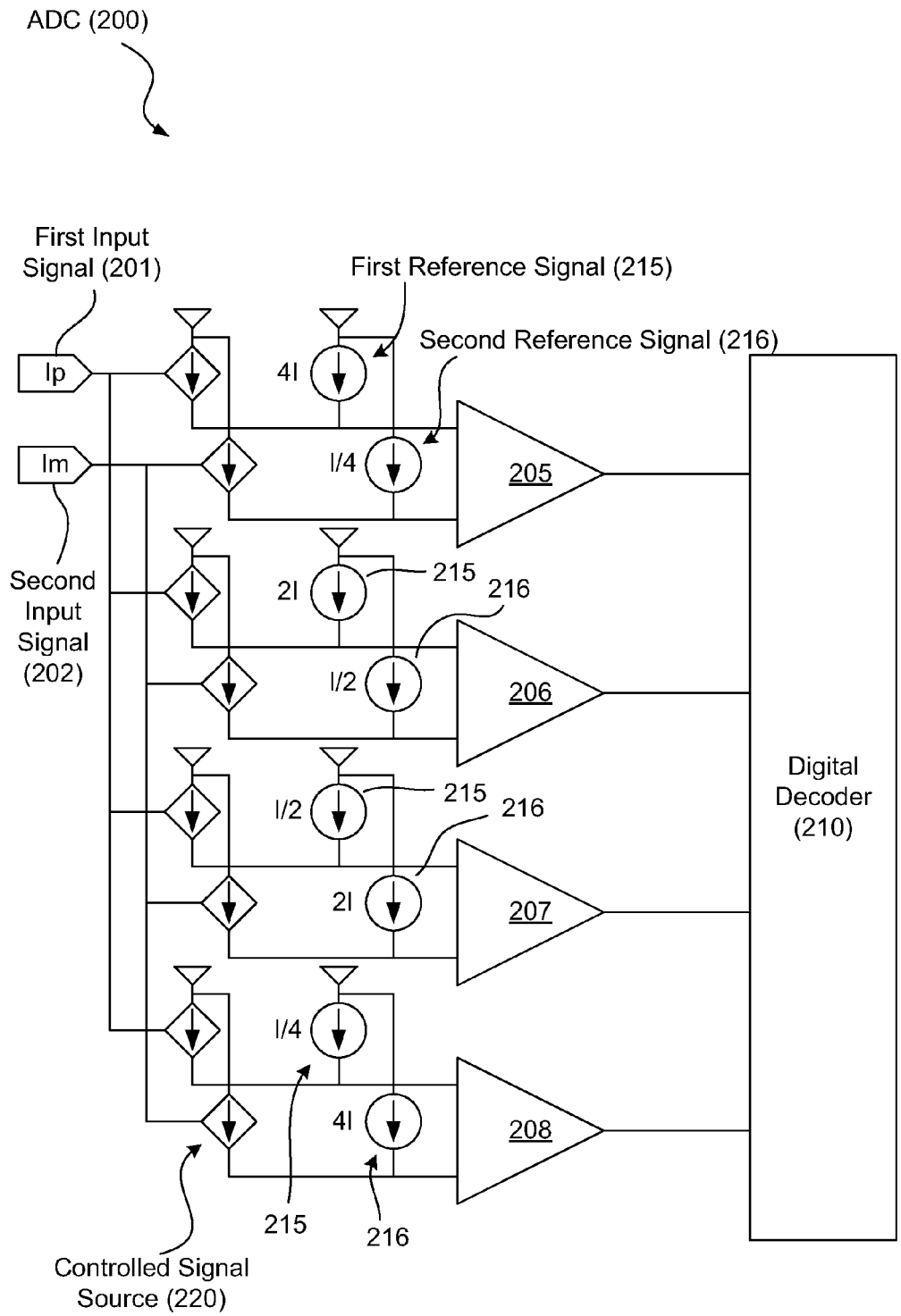
FIG. 2 is a diagram showing an illustrative analog-to-digital converter, according to one embodiment of principles described herein.

FIG. 2 is a diagram showing an illustrative analog-to-digital converter (200). According to certain illustrative embodiments, the ADC may include a number of comparators (205, 206, 207, 208). Each comparator (205, 206, 207, 208) may receive a first input signal (201) combined with a reference signal (215) and a second input signal (202) also combined with a reference signal (216). The output of each comparator may then be fed into a digital decoder (210).

In general, a comparator circuit is configured to compare two signals and output either a high signal representing a digital "1", or a low signal representing a digital "0". The output depends on the value of the signal received at the inputs to the comparator. In one embodiment, a comparator may use a reference signal. If an input signal is greater than the reference signal, the output of the comparator may be a high signal, or a digital "1." If an input signal is lower than the reference signal, then the comparator circuit may output a low signal, representing a digital "0." In this setup the reference signal acts as a trip point for the comparator circuit. The trip point may be defined as the value at which an input signal causes the comparator circuit to change its output. This method of setting a trip point on a comparator is merely one way of doing so. As will be appreciated by one skilled in the art, there may be other ways to use a comparator.

In certain embodiments, a comparator circuit may compare the difference between two input signals, each combined with a scaled reference signal. The reference signals may be scaled from a predetermined value based upon a desired trip point. The reference signals received by each comparator may be scaled to a different value so as to give a different trip point to each comparator within the ADC (200). In the case where the input signal is in the form of an electrical current, current controlled current sources (220) may be used to mirror or scale the input signals (201, 202) before combining them with the reference signals (215, 216). In accordance with Kirchhoff's current law as described above, the comparator circuits (205, 206, 207, 208) may receive an input that includes the summation of an input signal (201, 202) and a reference signal (215, 216). In addition, a Direct Current (DC) bias or fixed offset current may be added to each of the input signal (201, 202) before the input signals are input into the comparators (205, 206, 207, 208). Doing so may further adjust the trip points as desired.

The ADC (200) shown in FIG. 2 illustrates a two bit ADC. In one example, three comparators can be used to form a two bit ADC and the fourth comparator can be used for error correction. An n-bit ADC is able to produce an output signal having $2^n$ discrete values. Thus, the four bit ADC is able to output 16 discrete values represented by four bits. As mentioned above, the reference signals (215, 216) may be scaled differently for each comparator so as to give each comparator a different trip point. The first and second reference signals (215, 216) which are input into the first comparator (205) may have values of 4I and I/4. I can be an arbitrary current value such as 10 uA. A second comparator (206) may have respective reference signals (215, 216) scaled to 2I and I/2. A third comparator (207) may have respective reference signals (215, 216) scaled to I/2 and 2I. A fourth comparator (208) may have respective reference signals (215, 216) scaled to I/4 and 4I. As can be seen, the current value for the first reference signal (215) for each comparator decreases as the second reference signal (216) increases. In this manner, the trip point of each comparator is set to a different value. In certain embodiments, some of the reference signals (215, 216) may be used by multiple comparators (205, 206, 207, 208) by employing current mirrors or other methods of accurately duplicating current sources. Although the embodiment of FIG. 2 shows an ADC having 4 comparators (205, 206, 207, 208), the ADC (115) may include as many or as few comparators as required for its intended purpose. In one embodiment of a pipelined ADC, each stage may use an ADC having a different number of comparators (205, 206, 207, 208). Additionally, the ADC of each stage may include comparators (205, 206, 207, 208) having different reference signals (215, 216) than other stages.

Figure 3:
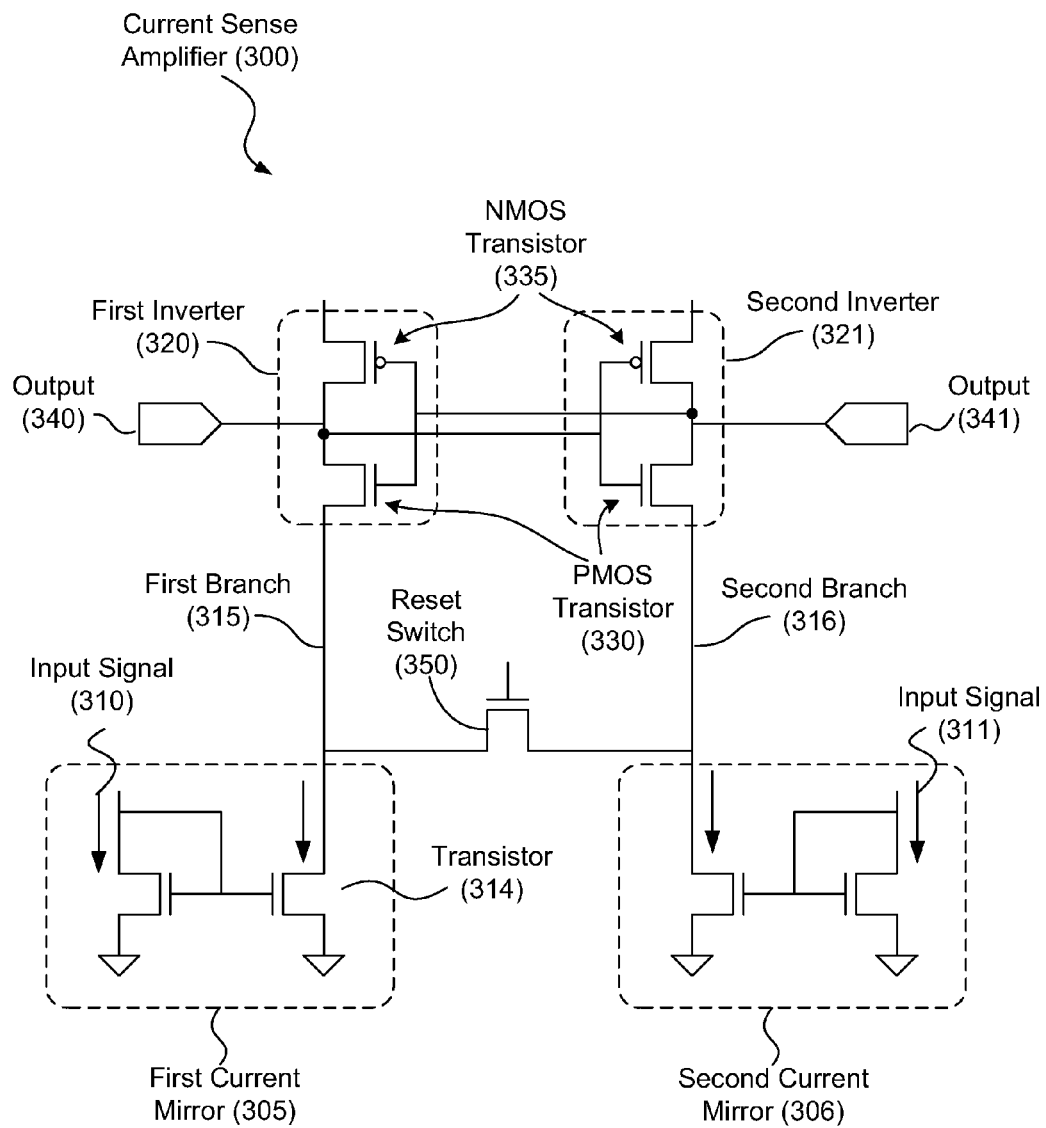
FIG. 3 is a diagram showing an illustrative current sense amplifier, according to one embodiment of principles described herein.

FIG. 3 is a diagram showing an illustrative current sense amplifier, according to one embodiment of principles described herein. A current sense amplifier may be used as a comparator circuit. Current sense amplifiers are able to detect current differences accurately at relatively high speeds such as less than 2 nanoseconds. Sense amplifiers may avoid many of the problems associated with parasitic capacitances common with voltage comparators. According to certain illustrative embodiments, a current sense amplifier may include a first inverter (320), a second inverter (321), two current mirrors (305, 306), and a reset switch (350). When the input currents (310, 311) change, the sense amplifier (300) is able to detect the change in input signals (310, 311) and alter the digital bit output (340, 341) to represent the change in current values.

An inverter is an electronic component designed to flip a digital signal from a "0" to a "1" and vice versa. An inverter may be constructed with an n-channel metal-oxide semiconductor field effect transistor (NMOS) (335) and a p-channel metal-oxide-semiconductor field effect transistor (PMOS) (330) as shown in FIG. 3. When two inverters are configured as shown in FIG. 3, the outputs are such that when one output is producing a high signal, the other output is producing a low signal. When one output changes, the other output will change as well. The output may be changed based on the value of the input signals (310, 311).

The input signals (310, 311) may be received through a current mirror. A current mirror is an electronic circuit device used to copy a current through an active device by controlling the current in another active device. The output current may remain constant despite loading. In an example, the input signal (310) input into a first current mirror (305) causes a voltage across the gate of the mirror transistor (314). This voltage causes a current to flow in the first branch (315) of the current sense amplifier (300). The amount of current that flows through the first branch (315) of the sense amplifier (300) is proportional to and depends upon the matching between the transistors comprising the first current mirror (305). The second current mirror (306) is set up similar to the first current mirror (305) such that an input signal (311) input into the second current mirror (306) causes a current to flow through a second branch (316) of the sense amplifier (300).

The inverters (320, 321) form a positive feedback loop. The positive feedback loop creates a higher gain for the sense amplifier than the gain created by the differential pair of transistors of the current mirrors (305, 306). In this formation, the current sense (300) amplifier may be used as a comparator.

Figure 4:
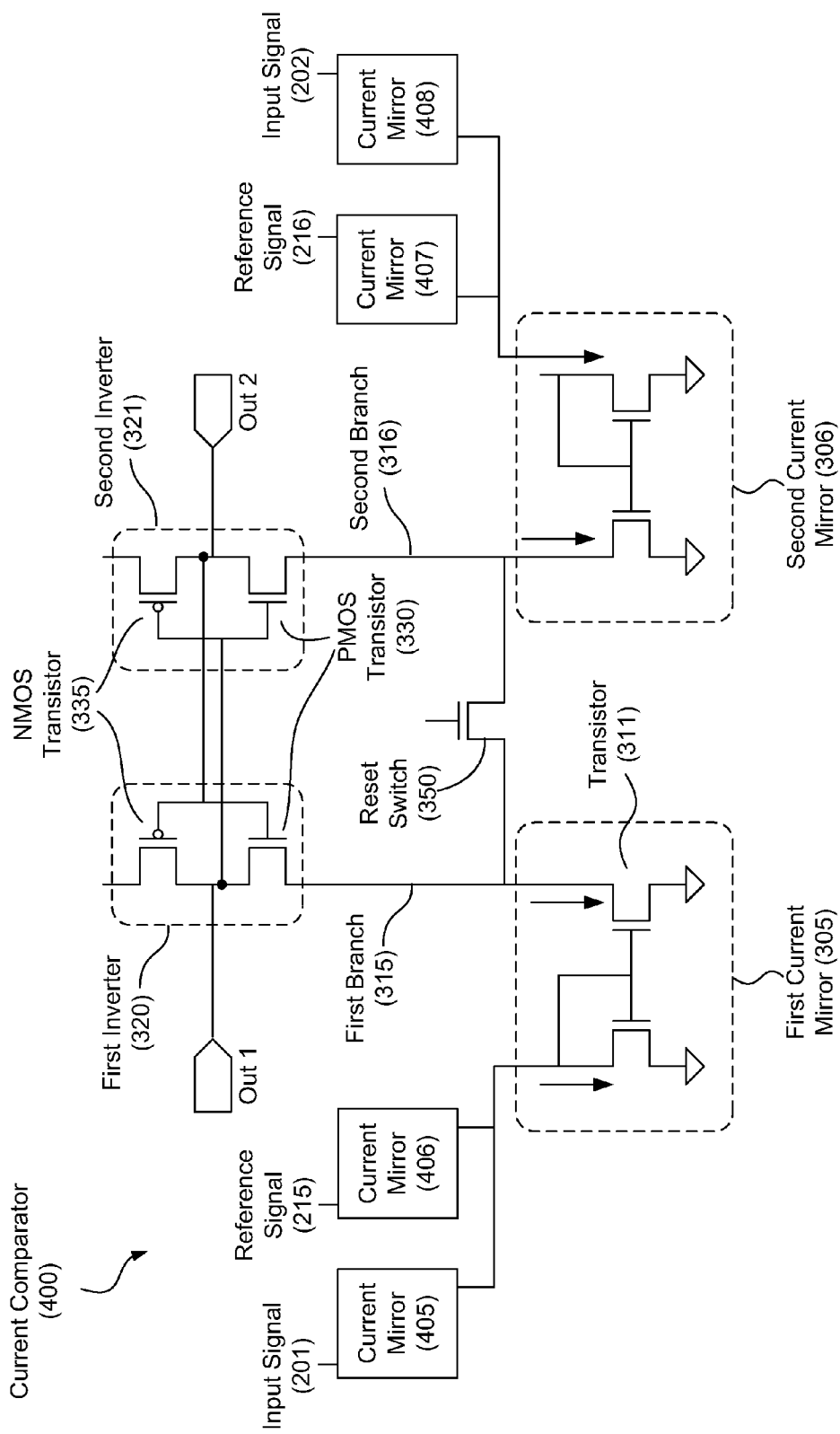
FIG. 4 is a diagram showing an illustrative comparator circuit, according to one embodiment of principles described herein.

FIG. 4 is a diagram showing an illustrative comparator circuit. According to certain illustrative embodiments, the sense amplifier (300) of FIG. 3 may be used as a comparator (400). The comparator includes a first input signal (201) and a second input signal (202). The comparator may also include a first reference signal (215) and a second reference signal (216).

The input currents (201, 202) and the reference signals (215, 216) may be introduced into the comparator (400) via a number of individual current mirrors (405, 406, 407, 408) and are subsequently fed into the pair of current mirrors (305, 306) of the sense amplifier (300). The first input signal (201) is introduced through a first current mirror (405) and the second input signal (202) is introduced through a second current mirror (408). Similarly, the first reference signal (215) is introduced through a third current mirror (406) and the second reference signal (216) is introduced through a fourth current mirror (407).

Current mirrors may be designed to reproduce a scaled current instead of a current with the same value. This may be done by scaling the dimensions of the transistor devices used in the current mirror. Thus the current mirrors (406, 407) producing the reference signals (215, 216) may be scaled appropriately so as to cause the comparator to trip at the desired point. By having the current mirrors (406, 407) scale the reference signals (215, 216), a single current source may be used for some or all of the comparators in an ADC. This may help to reduce the overall power consumption for the ADC. Furthermore, it may also allow for more accuracy in the reference signals (215, 216) in each of the comparators.

The input signals (201, 202) may be introduced through current mirrors (405, 406) so that same input signals (201, 202) may be used by a number of comparators. Using a current mirror isolates the current used by the sense amplifier from the input current. That way, the same input signal can be used to produce a mirrored current in several comparators without being affected by the loading created by the comparator circuitry. In some embodiments, cascode connections or other methods for increasing impedance may allow for higher impedance current sources, thus improving performance.

Because the first input signal (201) and the first reference signal (215) may be signals represented in terms of current rather than voltage, the currents may be combined before being input into the current mirror (305) of the first branch (315) of the current sense amplifier. Similarly, the second input signal (202) and the second reference signal (216) may be signals represented in terms of current. Thus they may be easily combined before being input into the current mirror (306) of the second branch (316) of the current sense amplifier. The current in each of the branches (315, 316) of the sense amplifier (300) initially matches the respective currents input into the pair of current mirrors (305, 306). Alternatively, the reference signals (215, 216) may be subtracted from the input signals (201, 202), depending on the desired configuration of the comparator (400) output.

In some embodiments, the circuit may be flipped such that the circuit has PMOS devices in the pair of current mirrors (305, 306), NMOS devices for the current mirrors (405, 406, 407, 408), and the sense amplifier positioned accordingly to give appropriate outputs. In another embodiment, either the reference mirrors (406, 407) or input mirrors (405, 408) may be designed such that the general equation for producing a high signal which represent a digital "1" may be as follows:

$$(K*Ip-Irefp_n)>(K*Im-Irefm_n) \text{ or }$$
$$(-K*Ip+Irefp_n)>(-K*Im+Irefm_n) \quad \text{(Eq. 1)}$$

Where
K is the scaled value;
Ip is the first input signal;
$Irefp_n$ is the first reference signal;
Im is the second input signal; and
$Irefm_n$ is the second reference signal.

This embodiment may be used to help illustrate how the trip point for the comparator (400) may be set by configuring the reference signals (215, 216) prior to operation. For example, a comparator with a first reference signal equal to I/2 and a second reference signal equal to 2I trips at different input current values than a comparator with a first reference signal equal to I/4 and a second reference signal equal to 4I. The output depends on the values of the first and second input currents with respect to the first and second reference signals (215, 216).

The accuracy of the mirrored currents may depend on the ability to accurately match the currents in the output of each of the current mirror to the current at its input. Transistor parameters such as threshold voltage and beta ($\beta$) value are often characteristics in which the variance between transistors occurs. Device mismatch may occur due to small differences in gate oxide thickness because of the inexact nature of growing oxide on wafers. Variations in etching and ion implantation also cause errors in device mismatch. Larger variations between mismatches result in greater inaccuracies when mirroring currents. More current mirrors in circuits such as comparators may make it more difficult to obtain accurate outputs for the sense amplifier circuit, though the circuits may be configured to have minimal device mismatch. Matching the devices may be difficult to do and may be expensive. The accuracy of the mirrored currents may also depend on the output impedance and the voltage at the drains of each device. However, rather than correcting all of the causes of inaccuracies at all of the current mirror inputs, a more simple adjustment may be to change where each comparator trips such that each comparator trips at the correct place, which takes the inaccuracies into account.

Current mirrors often exhibit a fair amount of parasitic capacitance. When operating at high speeds, this capacitance reduces the rate at which the mirrored current is able to change in response to changes in the input current. Thus, the frequency at which a device using the current mirror as inputs may be limited. In light of these and other difficulties, the applicant has discovered a configuration which allows a current to be input into the sense amplifier portion of the comparator circuit with a reduced parasitic capacitance.

In some cases, a DAC (410) can be used to adjust the value of a reference signal (215). For example, different digital inputs to the DAC may produce different analog outputs to serve as the reference signal. Adjusting the value of the reference signal will adjust the trip point of the comparator. Use of the DAC provides better control over the trip point of the comparator (400). In general, the DAC used to adjust the trip point of the comparator can be any type of practical DAC. In one example, a 4-bit current steering DAC with a Least Significant Bit (LSB) current which is a fraction of the reference current can be used. The LSB current is the amount of electric current used to differentiate between subsequent bit representations. For example, the difference between the amount of current used to represent a digital '0' and a digital '1' can be defined as the LSB current.

In one example, the DAC (410) can be connected to the input instead of the reference current. This will still allow the DAC (410) to effectively adjust the trip point of the comparator by adding or subtracting current from the input signal current level. The DAC (410) can be connected to one or both of the input signals (201, 202) and/or either one or both of the reference signals (215, 216). Furthermore, the DAC (410) can be a differential DAC which is connected to both input signals (201, 202) and/or both reference signals (215, 216).

Figure 5:
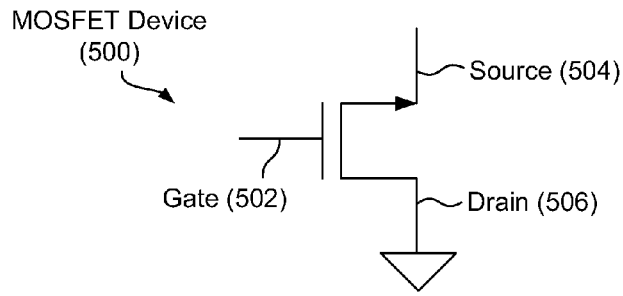
FIG. 5 is a diagram of an illustrative MOSFET device, according to one embodiment of principles described herein.

FIG. 5 is a diagram of an illustrative MOSFET device. A typical MOSFET device (500) includes a gate (502), a source (504) and a drain (506). Another type of transistor is a Bipolar Junction Transistor (BJT). BJTs perform the same function as MOSFETs but in a slightly different manner. The terminals on a BJT device are referred to the base, collector, and emitter respectively corresponding to the gate (502), source (504), and drain (506) of a MOSFET device (500). Although throughout this specification and accompanying drawings MOSFET devices are discussed and shown, it will be apparent to those skilled in the art that BJT devices may be used in place. Thus, any reference to a gate, source or drain in the specification and appended claims may refer respectively to a base, collector, and emitter in the case that the transistors used are BJT devices.

The gate (502) terminal of a MOSFET device (500) is generally used to switch the transistor between an ON state and an OFF state depending on the value of the signal received at the gate. When in an ON state, current may flow between the source (504) and drain the (506). When in an OFF state, current is prohibited from flowing between the source (504) and the drain (506).

However, in circuits such as a cascode configuration, the gate does not necessarily perform the same function. Based on the configuration of a transistor within a circuit, it may be referred to as common gate or common source configuration. A common gate configuration is when the input and the output correspond to the source and the drain. It is referred to as such because the gate is common to both the input and the output. Likewise if the input and the output correspond to the gate and the drain, the device is referred to as having a common source configuration.

Figure 6:
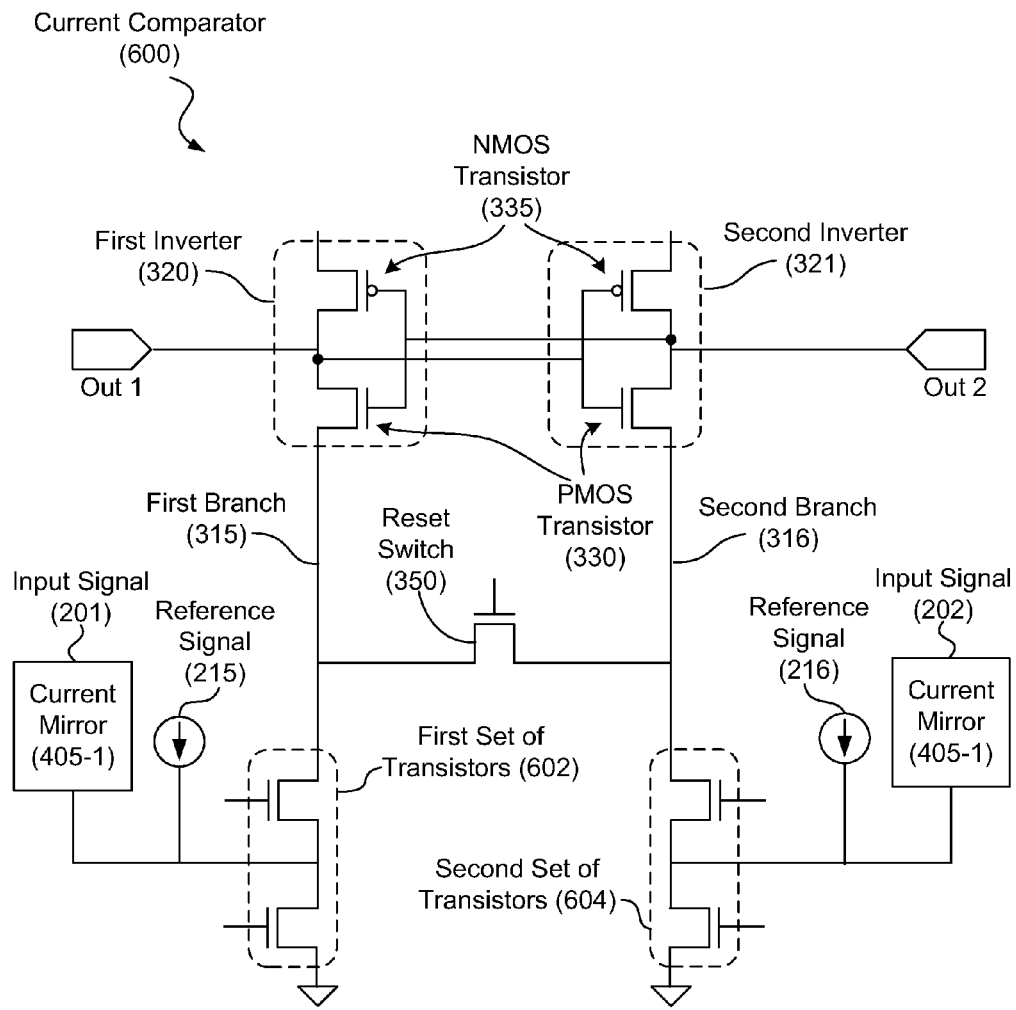
FIG. 6 is a diagram showing an illustrative comparator configured to receive inputs between two transistors, according to one embodiment of principles described herein.

FIG. 6 is a diagram showing an illustrative comparator configured to receive inputs between two common gate transistors. According to certain illustrative embodiments, a first set of transistors (602) in a cascode configuration may be used in place of a current mirror for the first branch (315) of the comparator (600). Likewise, a second set of transistors (604) in a cascode configuration may be used in place of the current mirror for the second branch (316) of the comparator (600).

A cascode configuration may include at least two transistor devices. Typically, one transistor is in a common source configuration while the other transistor is in a common gate configuration. Cascode configurations are often able to improve the isolation between input and output signals, thus reducing the miller effect. The miller effect accounts for an increase in parasitic capacitance of a circuit. Thus, by improving the input to output isolation, a lower capacitance may be realized. In turn, a higher operating bandwidth may be achieved.

According to certain illustrative embodiments, the input signal (201) combined with the reference signal (215) may be received into the comparator (600) between two transistors, each in a common gate configuration. The transistors may form a kind of cascode configuration. Likewise, a second input signal combined with a second reference signal may be received into the comparator (600) between a second set of transistors (604) in a common gate configuration. The two transistors also forming a kind of cascode configuration.

Receiving an input signal between two common gate transistors as shown in FIG. 6 may have several advantages over the comparator configuration shown in FIG. 4. As mentioned above, the cascode configuration allows the comparator to operate faster due to the lower capacitance. Additionally, the cascode configuration provides higher output impedance at the first and second branches (315, 316) than the current mirror shown in FIG. 4, improving the performance of the positive feedback connected inverters.

FIG. 6 also illustrates a DAC (410) connected to both inputs. These DACs (410) can add or remove current from the current level of the input signal. This can effectively alter the trip point for the comparator (600).

Figure 7:
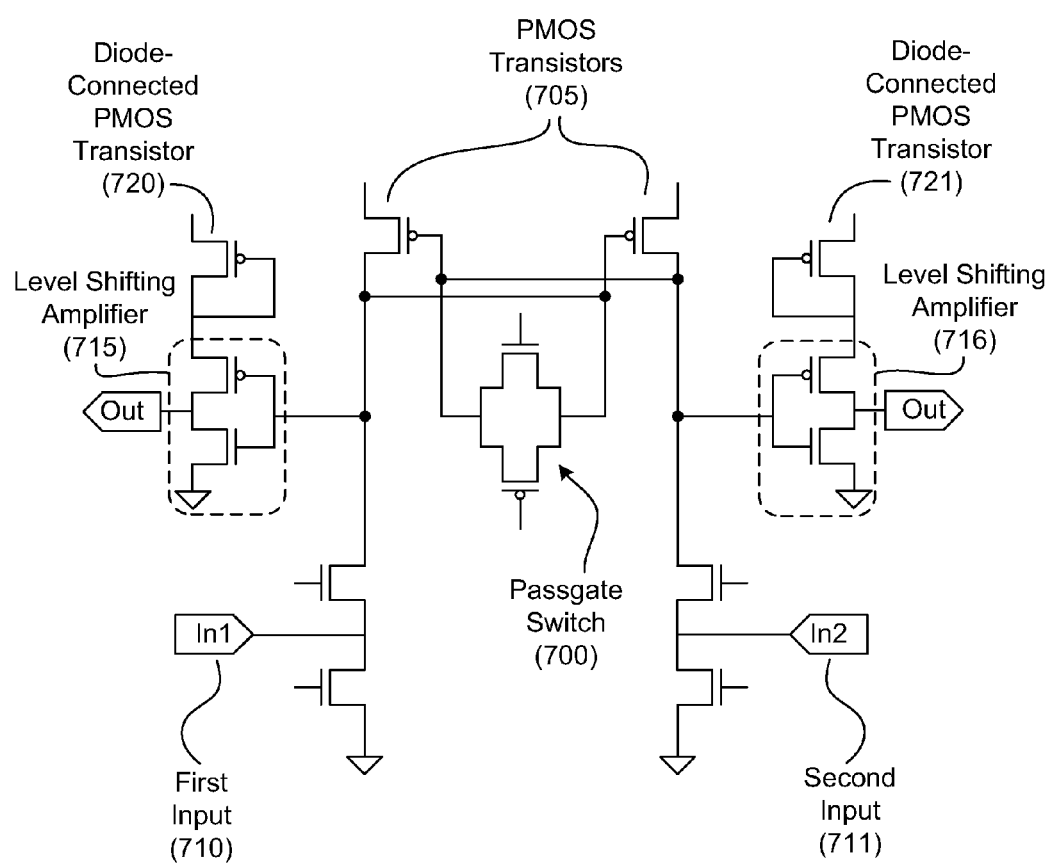
FIG. 7 is a diagram illustrating some configurations of a comparator, according to one embodiment of principles described herein.

FIG. 7 is a diagram illustrating some configurations of a comparator. According to certain illustrative embodiments, the inverters may be configured to form a passgate switch (700). Additionally, level-shifting amplifiers (715, 716) may be connected to the outputs.

A passgate switch (700) may also be referred to as a transmission gate. The passgate switch (700) may be used to isolate the signals in each branch of the comparator from one another when turned off. Additionally the passgate switch may be used to reset the comparator by allowing current to flow in either direction when turned on. The passgate switch (700) may also be advantageous in eliminating adverse threshold voltage effects that may be present in other types of switches.

In certain embodiments, the comparator outputs may be connected to one or more level-shifting amplifiers or inverters (715, 716). The threshold of each amplifier or inverter in this embodiment is level shifted by a diode-connected PMOS device (720, 721).

Figure 8:
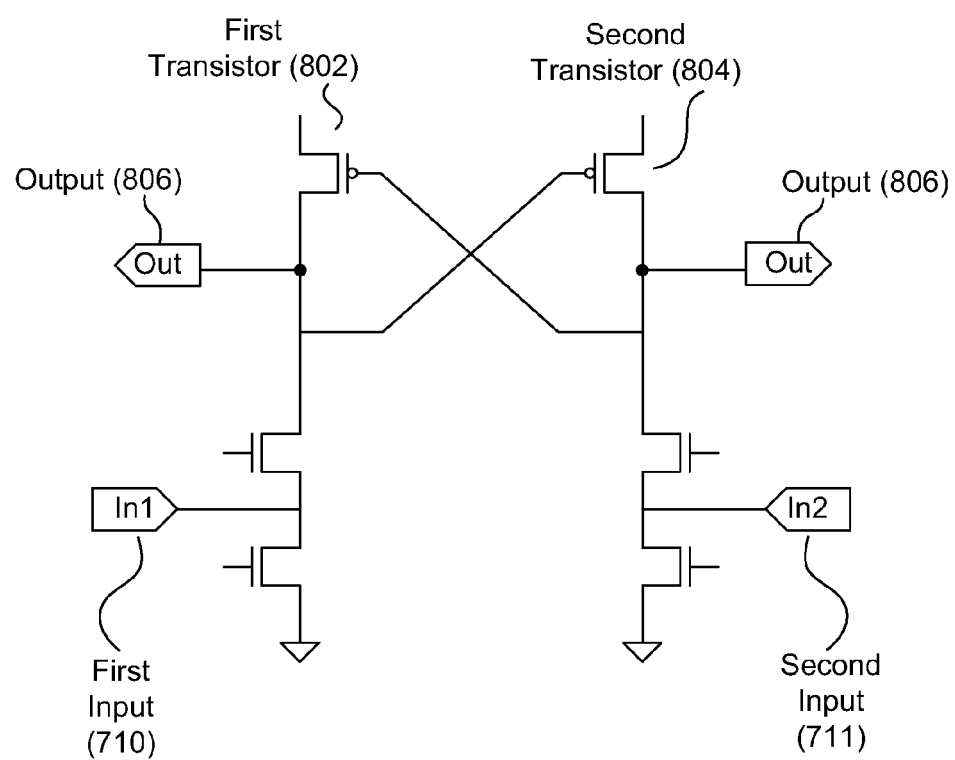
FIG. 8 is a diagram showing an illustrative comparator, according to one embodiment of principles described herein.

FIG. 8 is a diagram showing an illustrative comparator circuit including a cross-coupled regenerative load. A regenerative load is one that can provide a gain by creating a positive feedback loop. As mentioned above, a transistor in a common source configuration is such that the source is common to both the input and the output. Thus both the gate and the drain are used as an input or output to the transistor.

According to certain illustrative embodiments, a comparator with a cross-coupled regenerative load may include a first PMOS transistor (802) and a PMOS second transistor (804). The gate of the first transistor (802) may be connected to the drain of the second transistor (804) which in turn is used as an output (806). Likewise, the gate of the second transistor (804) may be connected to the drain of the first transistor (802) which in turn is also used as an output (806). This configuration operates similarly to the configuration shown in FIG. 6. When one output (806) is exhibiting a high signal representing a digital "1", the opposite output (806) is exhibiting a low signal representing a digital "0".

FIG. 9 is a flow chart showing an illustrative method (900) for comparing electrical signals. According to one illustrative embodiment, the method may include receiving (step 902) a first input signal between a first set of two transistors associated with the comparator circuit, the transistors from the first set of transistors being in a common gate configuration, receiving (step 904) a second input signal, combining (step 906) the first input signal with a reference signal and outputting (step 908) a value based on a comparison of the first analog signal and the second analog signal.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. An analog-to-digital converter comprising:
   a comparator configured to receive a first input signal and a second input signal;
   in which at least one of said input signals is received between a drain terminal of a first transistor device and a source terminal of a second transistor device.

2. The converter of claim 1, in which said comparator comprises an output comprising a level-shifting amplifier.

3. The converter of claim 1, further comprising a cross-coupled regenerative load.

4. The converter of claim 1, in which said comparator comprises a reset circuit for selectively resetting said comparator.

5. The converter of claim 1, in which a DAC is connected to an input of said comparator.

6. The converter of claim 5, in which an input to said DAC adjusts a trip point of said comparator.

7. The converter of claim 6, in which said DAC adjusts said trip point by one of altering one of said input signals and altering a reference signal.

8. The converter of claim 1, further comprising a reference signal source configured to produce a reference signal to be combined with at least one of said input signals before being compared by said comparator.

9. A method for comparing input signals performed by a comparator circuit, the method comprising:
   receiving a first input signal between a drain terminal of a first transistor of said comparator circuit and a source terminal of a second transistor of said comparator circuit;
   receiving a second input signal; and
   outputting a value based on a comparison of said first input signal and said second input signal.

10. The method of claim 9, in which receiving said second input signal comprises receiving said second input signal between a drain terminal of a third transistor of said comparator circuit and a source terminal of a fourth transistor of said comparator circuit.

11. The method of claim 9, in which comparator circuit further comprises a cross-coupled regenerative load.

12. The method of claim 9, further comprising selectively resetting said comparator circuit.

13. The method of claim 9, in which a value of one of said first input signal and said second input signal is connected to a Digital-to-Analog Converter (DAC).

14. The converter of claim 13, further comprising, adjusting a trip point of the comparator by changing an input to said DAC.

15. The converter of claim 13, in which said DAC is configured to receive a differential signal.

16. The method of claim 9, in which said transistors comprise one of CMOS transistors and bipolar junction transistors.

17. The method of claim 9, further comprising combining said first input signal with a reference signal.

18. An Analog-to-Digital Converter (ADC) comprising:
a comparator configured to:
- receive a first input signal between a drain terminal of a first transistor of said comparator circuit and a source terminal of a second transistor of said comparator circuit;
- receive a second input signal; and
- output a value based on a comparison of said first input signal and said second input signal.

19. The ADC of claim 18, in which to receive said second input signal, said comparator is configured to receive said second input signal between a drain terminal of a third transistor of said comparator circuit and a source terminal of a fourth transistor of said comparator circuit.

20. The converter of claim 18, in which said converter is further configured to combine said first input signal with a reference signal.

21. An analog-to-digital converter comprising:
- a comparator comprising a first transistor device and a second transistor device, wherein a drain terminal of said first transistor device is connected to a source terminal of said second transistor device; and
- two input terminals configured to receive, respectively, a first input signal and a second input signal;
- in which at least one of said input terminals is located on said connection between said drain terminal of said first transistor device and said source terminal of said second transistor device.

\* \* \* \* \*